12) United States Patent
Asamura et al.

(10) Patent No.: US 9,209,153 B2
(45) Date of Patent: Dec. 8, 2015

(54) SEMICONDUCTOR DEVICE AND METHOD OF MANUFACTURING THE SEMICONDUCTOR DEVICE

(71) Applicant: Renesas Electronics Corporation, Kawasaki-shi, Kanagawa (JP)

(72) Inventors: Norihiro Asamura, Kanagawa (JP); Takahiro Ishino, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/466,983

(22) Filed: Aug. 23, 2014

(65) Prior Publication Data

US 2015/0061160 A1 Mar. 5, 2015

(30) Foreign Application Priority Data

Aug. 28, 2013 (JP) ................. 2013-176723

(51) Int. Cl.
*H01L 23/48* (2006.01)
*H01L 23/52* (2006.01)
(Continued)

(52) U.S. Cl.
CPC .............. *H01L 24/49* (2013.01); *H01L 21/565* (2013.01); *H01L 23/4952* (2013.01); *H01L 23/49575* (2013.01); *H01L 24/06* (2013.01); *H01L 24/85* (2013.01); *H01L 24/97* (2013.01); *H01L 25/16* (2013.01); *H01L 23/3128* (2013.01); *H01L 24/45* (2013.01); *H01L 2224/05553* (2013.01); *H01L 2224/05554* (2013.01); *H01L 2224/32225* (2013.01); *H01L 2224/32245* (2013.01);

(Continued)

(58) Field of Classification Search
CPC ......... H01L 34/49; H01L 24/85; H01L 25/16; H01L 24/06; H01L 24/97; H01L 23/4952; H01L 23/49575; H01L 21/565; H01L 2224/48599; H01L 2224/48799; H01L 24/45; H01L 2224/00
USPC ......... 257/783–784, 738, 676, 773–778, 698, 257/737, 786, 686, 666, E23.141, E23.01, 257/E21.499; 438/126, 107, 118, 613, 125
See application file for complete search history.

(56) References Cited

U.S. PATENT DOCUMENTS 6,265,762 B1 7/2001 Tanaka et al.
8,318,548 B2 11/2012 Yamashita et al.
(Continued)

FOREIGN PATENT DOCUMENTS

JP 08-279527 A 10/1996
JP 2004-158875 A 6/2004
(Continued)

*Primary Examiner* — Amar Movva
*Assistant Examiner* — Sheikh Maruf
(74) *Attorney, Agent, or Firm* — Miles & Stockbridge P.C.

(57) ABSTRACT

Disclosed is a semiconductor device in which, when two adjacent semiconductor chips are coupled with bonding wires, a short circuit between the adjacent bonding wires can be suppressed. A first bonding wire, a second bonding wire, a third bonding wire, and a fourth bonding wire are lined up in this order along a first side. When viewed from a direction perpendicular to a chip mounting part, a maximum of the space between the first bonding wire and the second bonding wire is larger than that of the space between the second bonding wire and the third bonding wire. Further, a maximum of the space between the second bonding wire and the third bonding wire is larger than that of the space between the third bonding wire and the fourth bonding wire.

9 Claims, 17 Drawing Sheets

(51) Int. Cl.
*H01L 29/40* (2006.01)
*H01L 23/00* (2006.01)
*H01L 25/16* (2006.01)
*H01L 23/495* (2006.01)
*H01L 21/56* (2006.01)
*H01L 23/31* (2006.01)

(52) U.S. Cl.
CPC ............... *H01L2224/45144* (2013.01); *H01L 2224/45147* (2013.01); *H01L 2224/48091* (2013.01); *H01L 2224/48101* (2013.01); *H01L 2224/48137* (2013.01); *H01L 2224/48157* (2013.01); *H01L 2224/48227* (2013.01); *H01L 2224/48247* (2013.01); *H01L 2224/48599* (2013.01); *H01L 2224/48799* (2013.01); *H01L 2224/4903* (2013.01); *H01L 2224/49113* (2013.01); *H01L 2224/73265* (2013.01); *H01L 2224/85801* (2013.01); *H01L 2924/00014* (2013.01); *H01L 2924/1304* (2013.01); *H01L 2924/13091* (2013.01); *H01L 2924/141* (2013.01); *H01L 2924/15311* (2013.01); *H01L 2924/15321* (2013.01); *H01L 2924/2064* (2013.01)

(56) References Cited

U.S. PATENT DOCUMENTS

| | | | |
|---|---|---|---|
| 2004/0164385 A1* | 8/2004 | Kado et al. | 257/678 |
| 2010/0270689 A1* | 10/2010 | Kim et al. | 257/777 |
| 2011/0215400 A1* | 9/2011 | Nakamura et al. | 257/334 |
| 2012/0238056 A1 | 9/2012 | Numazaki | |
| 2012/0248439 A1* | 10/2012 | Lee | 257/48 |
| 2013/0161837 A1* | 6/2013 | Chen et al. | 257/783 |
| 2014/0027906 A1* | 1/2014 | Narita et al. | 257/738 |
| 2014/0091462 A1* | 4/2014 | Chen et al. | 257/738 |

FOREIGN PATENT DOCUMENTS

| | | |
|---|---|---|
| JP | 2011-040573 A | 2/2011 |
| JP | 2012-195331 A | 10/2012 |

* cited by examiner

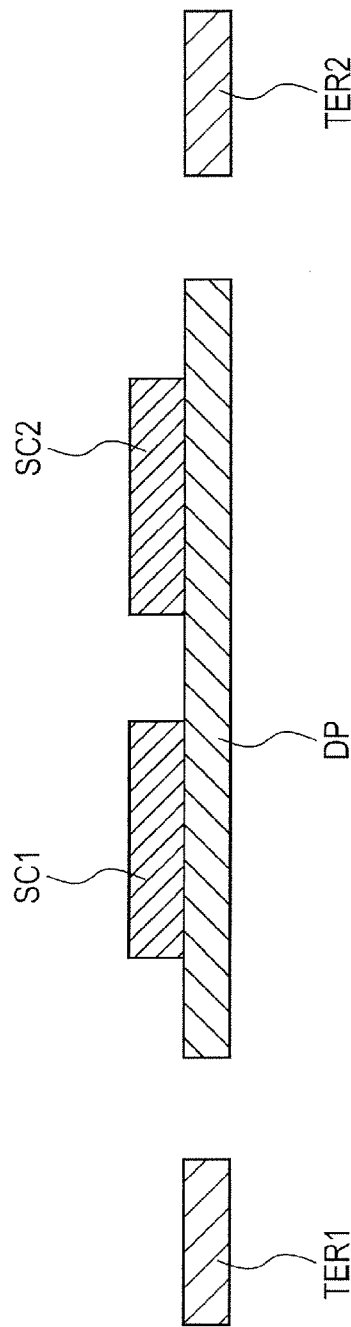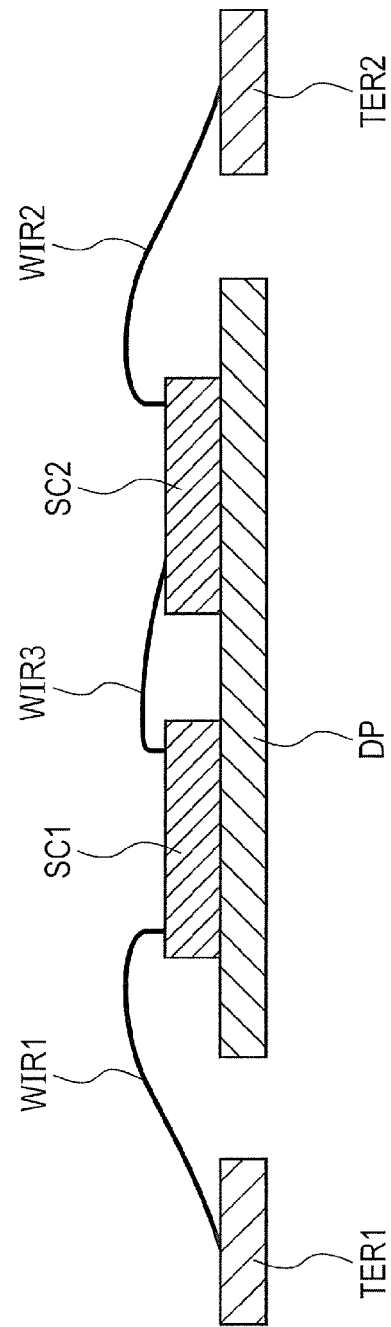

SEMICONDUCTOR DEVICE AND METHOD OF MANUFACTURING THE SEMICONDUCTOR DEVICE

CROSS-REFERENCE TO RELATED APPLICATIONS

The disclosure of Japanese Patent Application No. 2013-176723 filed on Aug. 28, 2013 including the specification, drawings and abstract is incorporated herein by reference in its entirety.

BACKGROUND

The present invention relates to a semiconductor device and a manufacturing method thereof, and in particular, to a technique that can be applied to a semiconductor device in which, for example, two semiconductor chips are coupled to each other via bonding wires and to a method of manufacturing the semiconductor device.

In a method of mounting a semiconductor chip, the semiconductor chip is mounted over a lead frame or an interposer such that the lead frame and the semiconductor chip are coupled to each other via bonding wires, and the semiconductor chip and the bonding wires are further sealed with a sealing resin. In manufacturing such a semiconductor device, there is the fear that the bonding wires may be deformed by a flow of the sealing resin, thereby causing a short circuit between the adjacent bonding wires.

To deal with the fear, Japanese Unexamined Patent Publication No. 2004-158875 discloses that, in a semiconductor device in which a semiconductor chip is mounted over a lead frame, the spaces between the inner leads of the lead frame are gradually increased as approaching a corner of a die pad (supporting body).

SUMMARY

In a semiconductor device, a plurality of semiconductor chips are mounted over a die pad or an interposer of a lead frame. On the other hand, the miniaturization of semiconductor devices has been developed in recent years. As a result of the investigation by the present inventors, it has been found that, when two adjacent semiconductor chips are coupled to each other via bonding wires in such a semiconductor device, there is the fear that the bonding wires may be deformed by a flow of a sealing resin, thereby causing a short circuit between the adjacent bonding wires. Other problems and new characteristics will become clear from the description and accompanying drawings of the present specification.

According to one embodiment, a first semiconductor chip and a second semiconductor chip are mounted over a chip mounting part, which are coupled to each other via a plurality of bonding wires. A first side of the first semiconductor chip faces a fifth side of the second semiconductor chip. The first semiconductor chip has a plurality of first electrode pads arranged along the first side, and the second semiconductor chip has a plurality of second electrode pads arranged along the fifth side. A first bonding wire, a second bonding wire, a third bonding wire, and a fourth bonding wire are lined up in this order along the first side. When viewed from a direction perpendicular to the chip mounting part, a maximum of a space between the first bonding wire and the second bonding wire is larger than that of a space between the second bonding wire and the third bonding wire. Further, a maximum of a space between the second bonding wire and the third bonding wire is larger than that of a space between the third bonding wire and the fourth bonding wire.

According to another embodiment, a first semiconductor chip and a second semiconductor chip are mounted over a chip mounting part, which are coupled to each other via a plurality of bonding wires. A first side of the first semiconductor chip faces a fifth side of the second semiconductor chip. The first semiconductor chip has a plurality of first electrode pads arranged along the first side, and the second semiconductor chip has a plurality of second electrode pads arranged along the fifth side. A first bonding wire, a second bonding wire, a third bonding wire, and a fourth bonding wire are lined up in this order along the first side. When viewed from a direction perpendicular to the chip mounting part, a space between a second electrode pad coupled to the first bonding wire and a second electrode pad coupled to the second bonding wire is larger than that between the second electrode pad coupled to the second bonding wire and a second electrode pad coupled to the third bonding wire. Further, the space between the second electrode pad coupled to the second bonding wire and the second electrode pad coupled to the third bonding wire is larger than that between the second electrode pad coupled to the third bonding wire and a second electrode pad coupled to the fourth bonding wire.

According to each of the aforementioned embodiments, a short circuit between adjacent bonding wires can be suppressed, when two adjacent semiconductor chips are coupled to each other via bonding wires.

BRIEF DESCRIPTION OF THE DRAWINGS

FIG. 9 is a view illustrating the method of manufacturing a semiconductor device;

FIG. 10 is a view illustrating the method of manufacturing a semiconductor device;

DETAILED DESCRIPTION

Figure 1:
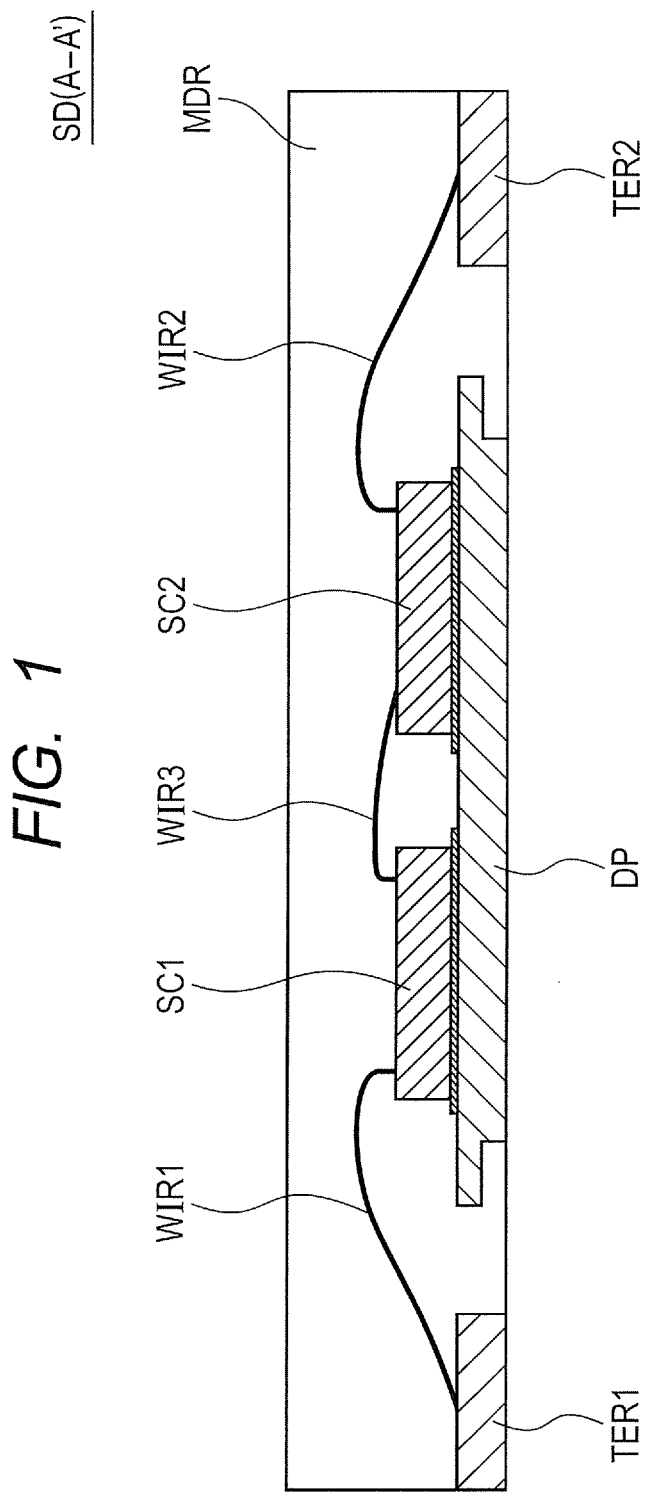
FIG. 1 is a sectional view illustrating a configuration of a semiconductor device according to an embodiment.

Hereinafter, preferred embodiments will be described with reference to accompanying drawings. The same or like components illustrated in each drawing are denoted by like reference numerals, and duplicative descriptions will be appropriately omitted.

(Embodiment)

FIG. 1 is a sectional view illustrating a configuration of a semiconductor device SD according to an embodiment. The semiconductor device SD according to the present embodiment has a configuration in which a first semiconductor chip SC1 and a second semiconductor chip SC2 are mounted over a first surface of a chip mounting part DP. The chip mounting part DP is, for example, a die pad of a lead frame. The first semiconductor chip SC1 is coupled to a first terminal TER1 via a bonding wire WIR1, while the second semiconductor chip SC2 is coupled to a second terminal TER2 via a bonding wire WIR2. The first terminal TER1 and the second terminal TER2 are, for example, lead terminals of the lead frame. The first semiconductor chip SC1 and the second semiconductor chip SC2 are coupled to each other via a bonding wire WIR3. The bonding wires WIR1, WIR2, and WIR3 are, for example, gold wires, but may be formed of another metal (e.g., copper).

A first surface of the chip mounting part DP, the first semiconductor chip SC1, the second semiconductor chip SC2, and the bonding wires WIR1, WIR2, and WIR3 are sealed with a sealing resin MDR. In the example illustrated in this view, the semiconductor device SD is a QFN (Quad For Non-Lead Package). Accordingly, the end surfaces of the first terminal TER1 and the second terminal TER2 form the same surfaces as those of the sealing resin MDR. A surface (second surface) of the chip mounting part DP opposite to the first surface, and a surface of each of the first terminal TER1 and the second terminal TER2 are exposed from the bottom surface of the sealing resin MDR to form the same surface as the bottom surface thereof. However, the semiconductor device SD may have another sealing structure.

Figure 2:
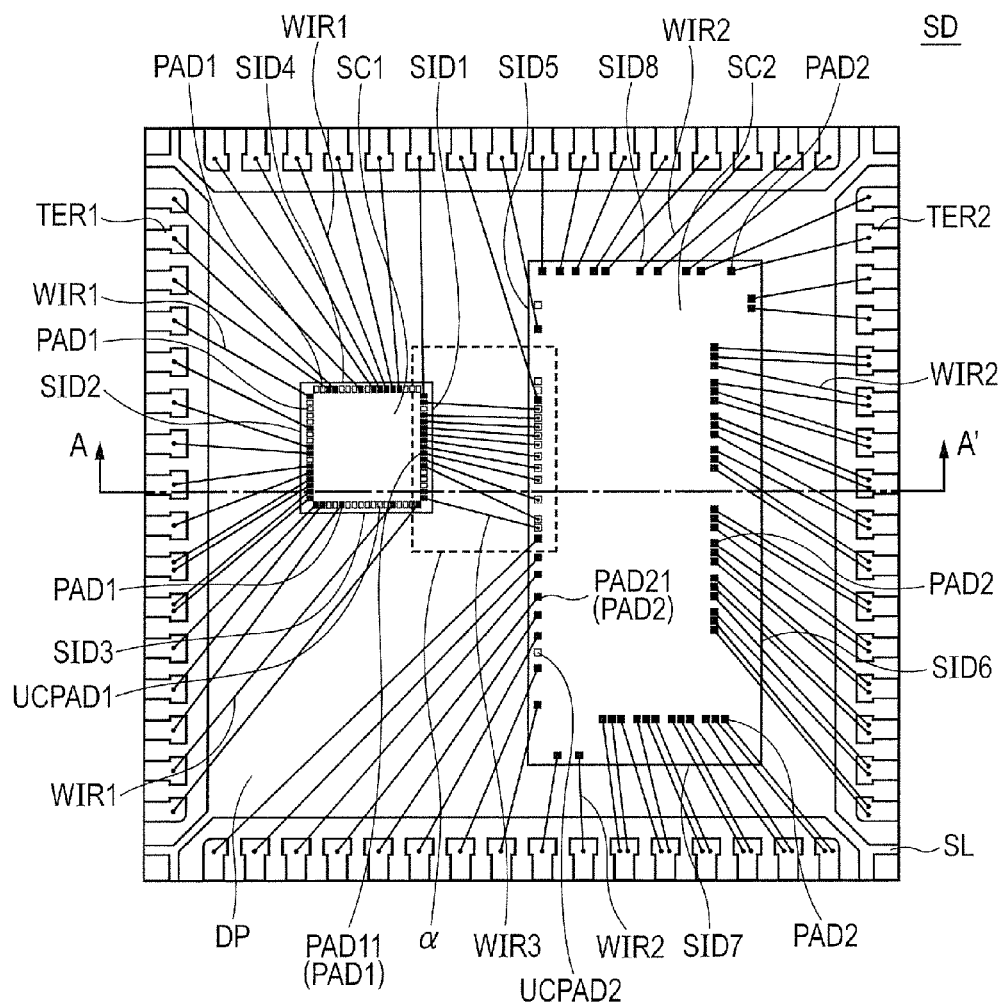
FIG. 2 is a plan view of the semiconductor device.

FIG. 2 is a plan view of the semiconductor device SD. In the present view, the sealing resin MDR is omitted for explanation. Herein, FIG. 1 corresponds to A-A' Section in FIG. 2.

The planar shape of the first semiconductor chip SC1 is a rectangle, that is, for example, a square or an oblong having an aspect ratio of 1.5 or less. The first semiconductor chip SC1 has a first side SID1, a second side SID2, a third side SID3, and a fourth side SID4. The first side SID1 faces a fifth side SID5 of the second semiconductor chip SC2. The second side SID2 is a side facing the first side SID1, and the third side SID3 and the fourth side SID4 are remaining two sides.

The first semiconductor chip SC1 has a plurality of electrode pads PAD1. The electrode pads PAD1 are arranged along the four sides of the first semiconductor chip SC1. With the development of high integration of semiconductor devices, the length of one side of the first semiconductor chip SC1 is, for example, 1.5 mm or more and 2.0 mm or less. The electrode pads PAD1 are arranged at equal intervals. The space between adjacent electrode pads PAD1 is, for example, 75 um or less. However, eight electrode pads PAD1, located next to the four corners of the first semiconductor chip SC1, are arranged to be slightly away from the electrode pads PAD1 located next to them.

Electrode pads PAD1 (first electrode pads PAD11) arranged along the first side SID1 are coupled to the second semiconductor chip SC2 via the bonding wires WIR3. Electrode pads PAD1, arranged along the second side SID2, the third side SID3, and the fourth side SID4, are coupled to the first terminals TER1 via the bonding wires WIR1.

In the example illustrated in this view, the first semiconductor chip SC1 is a general-purpose microcontroller (microcontroller (MCU: Micro Control Unit) or microprocessor (MPU: Micro-Processing Unit)). Accordingly, electrode pads PAD1 (uncoupled electrode pads UCPAD1), each of which is coupled to no bonding wire, are provided in the first semiconductor chip SC1. In the example illustrated in this view, the uncoupled electrode pads UCPAD1 are provided in areas each of which is arranged at each of the four sides of the first semiconductor chip SC1. However, at least one side of the first semiconductor chip SC1 may not have the uncoupled electrode pad UCPAD1.

The second semiconductor chip SC2 has, for example, an analog circuit and a transistor (later-described power transistor PTR) for current control, and the planar shape thereof is larger than that of the first semiconductor chip SC1. Specifically, the second semiconductor chip SC2 is an oblong having an aspect ratio of 2.0 or more. The length of the long side of the second semiconductor chip SC2 is 6.0 mm or more and 6.5 mm or less, which is larger than the first side SID1. On the other hand, the length of the short side of the second semiconductor chip SC2 is 2.0 mm or more and 3.0 mm or less.

The second semiconductor chip SC2 has the fifth side SID5, a sixth side SID6, a seventh side SID7, and an eighth side SID8. The fifth side SID5 faces the first side SID1 of the first semiconductor chip SC1. The sixth side SID6 faces the fifth side SID5. In the example illustrated in this view, the fifth side SID5 and the sixth side SID6 are the long sides of the second semiconductor chip SC2. The remaining two sides (the seventh side SID7 and the eighth side SID8) of the second semiconductor chip SC2 are the short sides.

The second semiconductor chip SC2 has a plurality of electrode pads PAD2. The electrode pads PAD2 are arranged along the four sides of the second semiconductor chip SC2. The space between adjacent electrode pads PAD2 is different from others, depending on which element in the second semiconductor chip SC2 the adjacent electrode pads are coupled to. Accordingly, the spaces between the electrode pads PAD2 are more random than those between the electrode pads PAD1. Accordingly, the dispersion of the spaces between the electrode pads PAD2 is larger than that of the spaces between the electrode pads PAD1.

Of the electrode pads PAD2 arranged along the fifth side SID5 of the second semiconductor chip SC2, most of the electrode pads PAD2 (second electrode pad PAD21), which are located in the portion overlapped with the first side SID1 of the first semiconductor chip SC1 in a direction in which the fifth side SID5 extends, are coupled to the first semiconductor chip SC1 via the bonding wires WIR3. On the other hand, of the electrode pads PAD2 arranged along the fifth side SID5, most of the electrode pads PAD2, which are located in a portion not overlapped with the first side SID1 of the first semiconductor chip SC1 in the direction in which the fifth side SID5 extends, are coupled to the second terminals TER2 via the bonding wires WIR2. The electrode pad PAD2 arranged along the sixth side SID6, those arranged along the seventh side SID7, and those arranged along the eighth side SID8 are also coupled to the second terminals TER2 via the bonding wires WIR2.

Herein, electrode pads PAD2 (uncoupled electrode pads UCPAD2), each of which is coupled to no bonding wire, are also provided in the second semiconductor chip SC2. However, the number of the uncoupled electrode pads UCPAD2 is smaller than that of the uncoupled electrode pads UCPAD1.

In the example illustrated in this view, the chip mounting part DP, the first terminals TER1, and the second terminals TER2 form a lead frame. Accordingly, a suspension lead SL is attached in each of the four corners of the chip mounting part DP.

Because this lead frame is a general-purpose one, the chip mounting part DP is a square. The length of one side of the chip mounting part DP is, for example, 7.0 mm is more and 7.5 mm or less. Herein, the difference between the length of one side of the chip mounting part DP and the length of the long side of the second semiconductor chip SC2 is 1.0 mm or more and 1.5 mm or less. Accordingly, the difference between the length of one side of the chip mounting part DP and the total length of the length of the second side SID2 of the first semiconductor chip SC1 and the length of the seventh side SID7 of the second semiconductor chip SC2 becomes large to some extent. In order to reduce the lengths of the bonding wires WIR3, it is required to bring the first semiconductor chip SC1 and the second semiconductor chip SC2 close to each other. With such a configuration, however, the total of the lengths of the bonding wires WIR1 and those of the bonding wires WIR2 becomes large. Accordingly, the first side SID1 of the first semiconductor chip SC1 and the fifth side SID5 of the second semiconductor chip SC2 are spaced apart from each other to some extent, for the purpose of reducing the total of the lengths of the bonding wires the semiconductor device SD has. Accordingly, the lengths of the bonding wires WIR3 become large to some extent. The distance between the first side SID1 and the fifth side SID5 is, for example, 1.0 mm or more and 1.5 mm or less.

Figure 3:
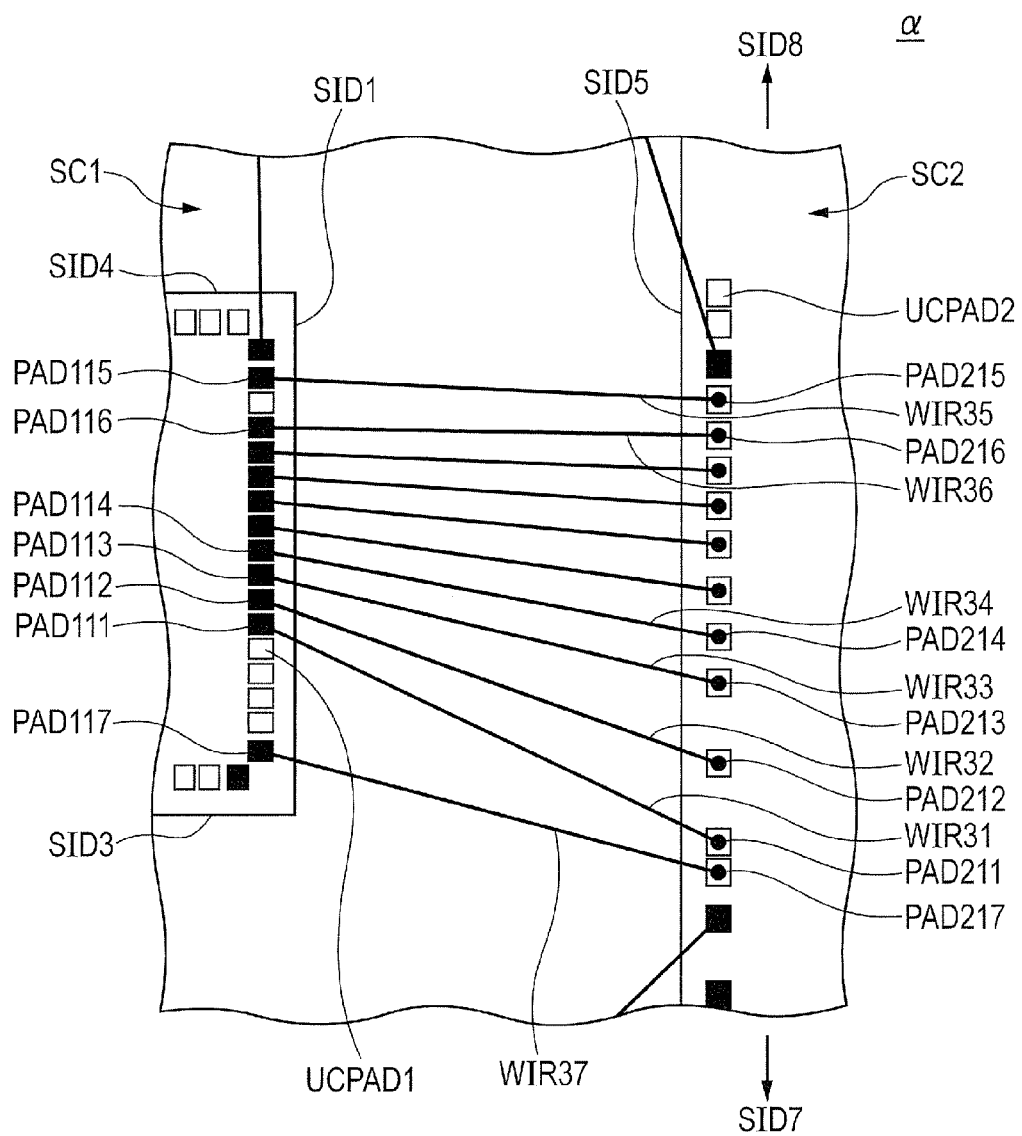
FIG. 3 is a view in which the region enclosed by the dotted line α in FIG. 2 is enlarged.

FIG. 3 is a view in which the region enclosed by the dotted line α in FIG. 2 is enlarged. As described above, the electrode pads PAD1 (first electrode pads PAD11) are arranged side by side at the first side SID1 of the first semiconductor chip SC1, while the electrode pads PAD2 (second electrode pads PAD21) are arranged side by side in an area near the second side SID2 of the second semiconductor chip SC2. These first electrode pads PAD11 are coupled, on a one-to-one basis, to the second electrode pads PAD21 via the bonding wires WIR3. The spaces between the first electrode pads PAD11 and the second electrode pads PAD21 are, for example, 1.0 mm or more in a direction perpendicular to the first side SID1.

In detail, the bonding wires WIR3 include a first bonding wire WIR31, a second bonding wire WIR32, a third bonding wire WIR33, and a fourth bonding wire WIR34. These four wires are arranged in this order along the first side SID1. Specifically, the first bonding wire WIR31, the second bonding wire WIR32, the third bonding wire WIR33, and the fourth bonding wire WIR34 are lined up in this order in a direction from the third side SID3 toward the fourth side SID4.

The space between the first electrode pad PAD11 (first electrode pad PAD111), coupled to the first bonding wire WIR31, and the first electrode pad PAD11 (first electrode pad PAD112), coupled to the second bonding wire WIR32, is almost equal to that between the first electrode pad PAD112 and the first electrode pad PAD11 (first electrode pad PAD113) coupled to the third bonding wire WIR33. The space between the first electrode pad PAD112 and the first electrode pad PAD113 is almost equal to that between the first electrode pad PAD113 and the first electrode pad PAD11 (first electrode pad PAD114) coupled to the fourth bonding wire WIR34. The uncoupled electrode pad UCPAD1 is not provided between the first electrode pad PAD111 and the first electrode pad PAD114, that is, between the first bonding wire WIR31 and the fourth bonding wire WIR34.

On the other hand, the space between the second electrode pad PAD21 (second electrode pad PAD211), coupled to the first bonding wire WIR31, and the second electrode pad PAD21 (second electrode pad PAD212), coupled to the second bonding wire WIR32, is larger than that between the second electrode pad PAD212 and the second electrode pad PAD21 (second electrode pad PAD213) coupled to the third bonding wire WIR33. Further, the space between the second electrode pad PAD212 and the second electrode pad PAD213 is larger than that between the second electrode pad PAD213 and the second electrode pad PAD21 (second electrode pad PAD214) coupled to the fourth bonding wire WIR34.

Accordingly, When viewed from the direction perpendicular to the chip mounting part, a maximum of the space between the first bonding wire WIR31 and the second bonding wire WIR32 is larger than that of the space between the second bonding wire WIR32 and the third bonding wire WIR33. Further, a maximum of the space between the second bonding wire WIR32 and the third bonding wire WIR33 is larger than that of the space between the third bonding wire WIR33 and the fourth bonding wire WIR34. Herein, the spaces between these bonding wires are defined as the spaces in a direction parallel, for example, to the first side SID1.

Figure 4:
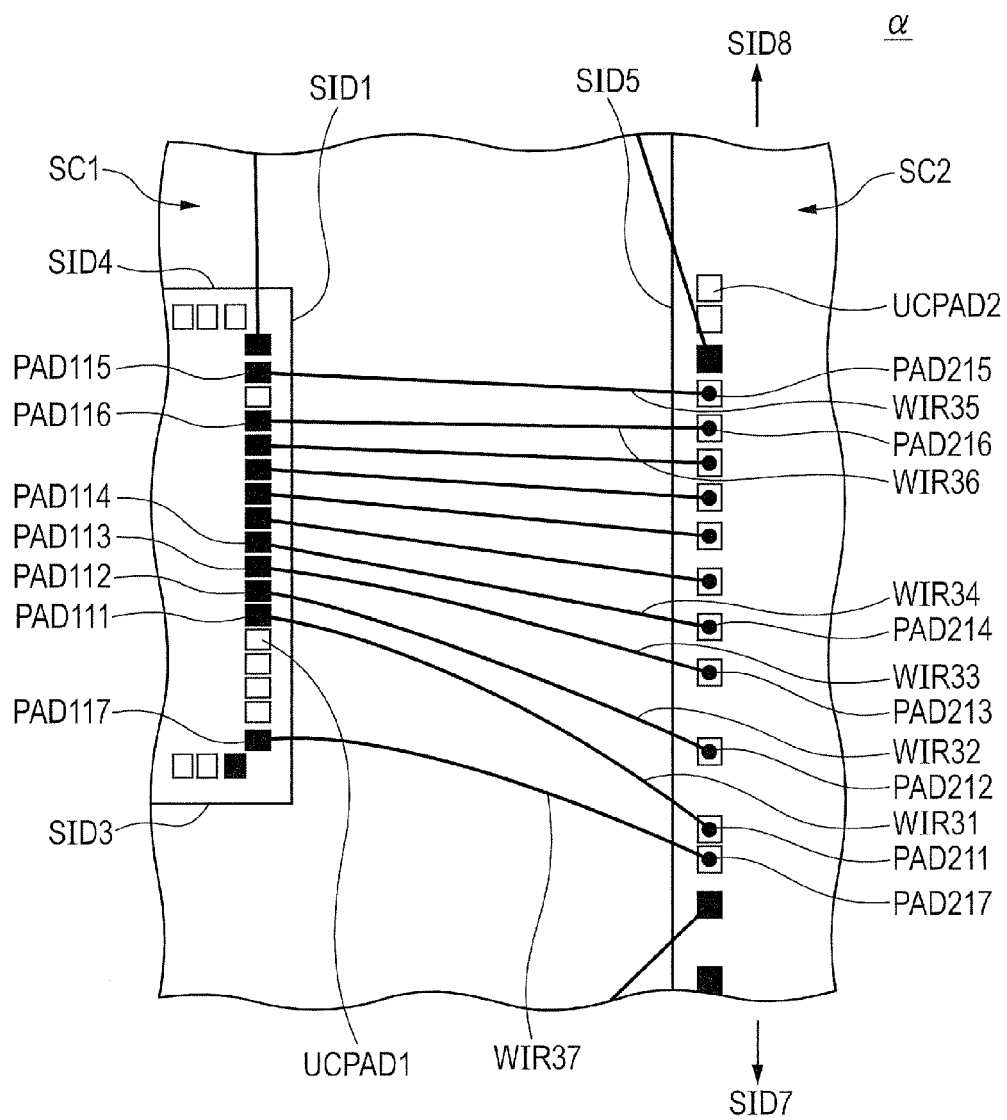
FIG. 4 is a view illustrating a state in which wires in FIG. 3 are curved.

With such a configuration, a short circuit between the adjacent bonding wires WIR3 can be suppressed, even if the bonding wires WIR3 (in particular, the first bonding wire WIR31) are curved in a direction of being convex toward the fourth side SID4 with a wire flow occurring, as illustrated in FIG. 4, when the sealing resin MDR is poured in a direction from the third side SID3 toward the fourth side SID4.

In the example illustrated in this view and in at least four second electrode pads PAD21 located nearer to the eighth side SID8 than to the second electrode pad PAD212, the space, between a second electrode pad PAD21 and the second electrode pad PAD21 located next to the above second electrode pad PAD21 and near to the eighth side SID8, becomes smaller little by little (by an amount of, for example, 5 μm or more and 15 μm or less) as approaching the eighth side SID8. Accordingly, a short circuit between the adjacent bonding wires WIR3 can be further suppressed.

In the example illustrated in this view, in the ends of the first bonding wire WIR31, the second bonding wire WIR32, the third bonding wire WIR33, and the fourth bonding wire WIR34, the ends located at the side of the fifth side SID5 are inclined in the direction of approaching the seventh side SID7, in a plan view.

In the example illustrated in this view, a maximum of the space between the bonding wire WIR3 (fifth bonding wire WIR35), located nearest to the fourth side SID4, and a sixth bonding wire WIR36, located next to the fifth bonding wire WIR35, is smaller than that of the space between the first bonding wire WIR31 and the second bonding wire WIR32.

Further, the space between the bonding wire WIR3 (seventh bonding wire WIR37), located nearest to the third side SID3, and the bonding wire WIR3 (in this example illustrated herein, first bonding wire WIR31), located next to the seventh bonding wire WIR37, is larger than that between the first bonding wire WIR31 and the second bonding wire WIR32.

In the example illustrated in this view, at least one uncoupled electrode pad UCPAD1 is provided between the first electrode pad PAD11 (first electrode pad PAD117), coupled to the seventh bonding wire WIR37, and the first electrode pad PAD111. Accordingly, a maximum of the space between the first bonding wire WIR31 and the seventh bonding wire WIR37 can be increased, even if the space between the second electrode pad PAD211 and the second electrode pad PAD21 (second electrode pad PAD217), coupled to the seventh bonding wire WIR37, is made smaller than that between the second electrode pad PAD211 and the second electrode pad PAD212.

Figure 5:
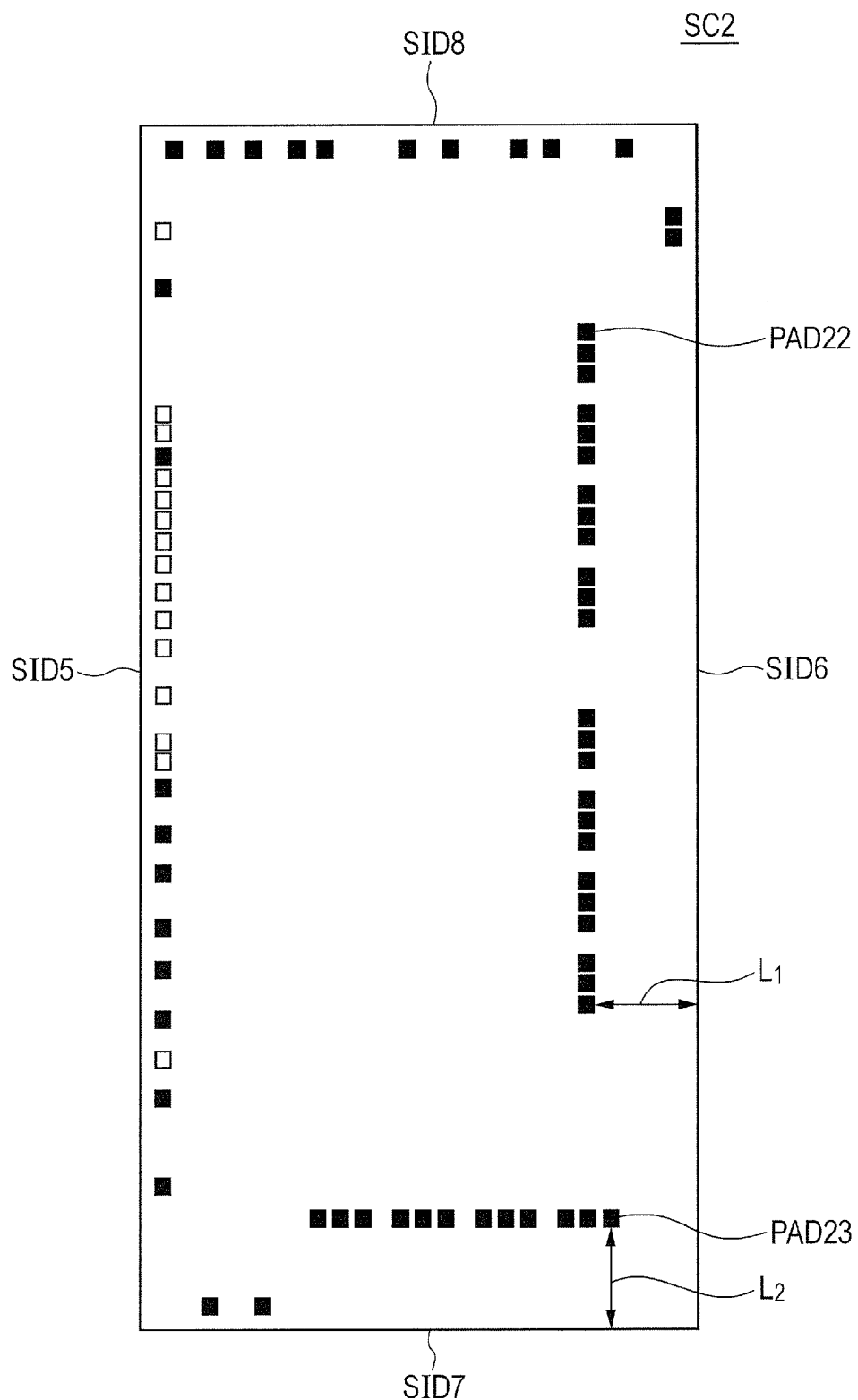
FIG. 5 is a plan view of a second semiconductor chip.
Figure 6:
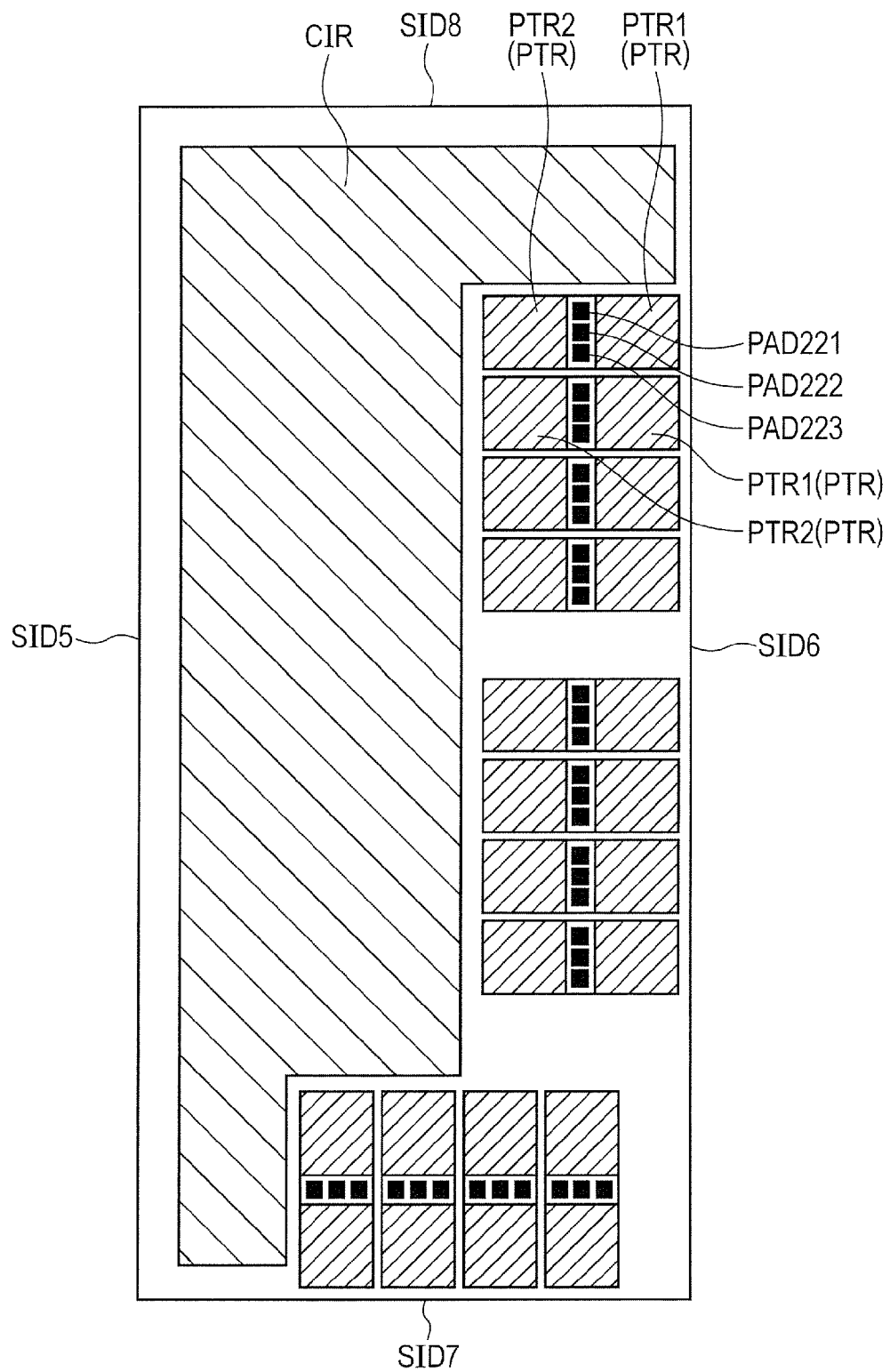
FIG. 6 is a plan view illustrating a layout of a circuit and elements of the second semiconductor chip.
Figure 7:
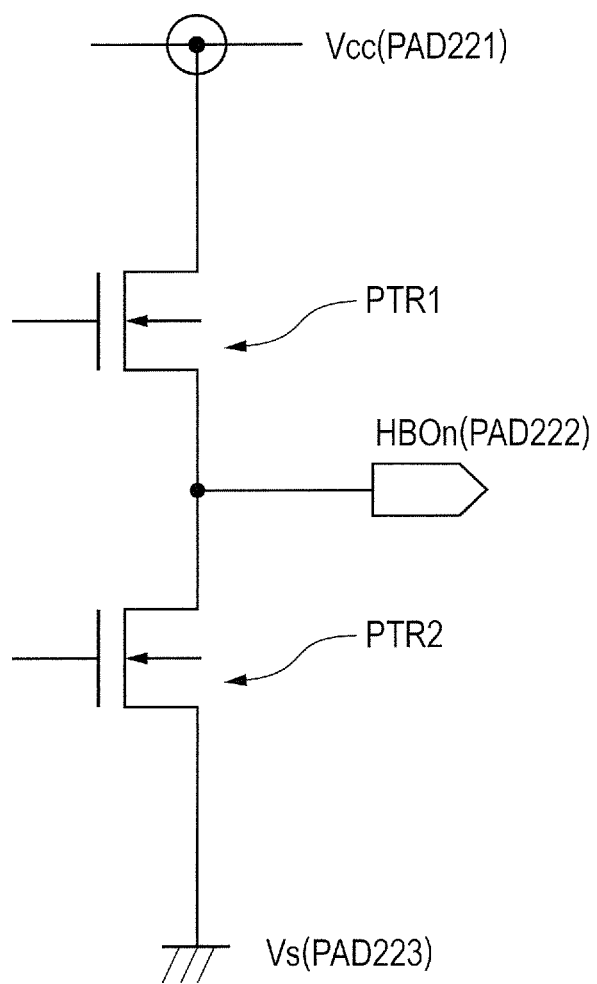
FIG. 7 is a circuit schematic illustrating part of the circuit of the second semiconductor chip.

FIG. 5 is a plan view of the second semiconductor chip SC2. FIG. 6 is a plan view illustrating a layout of a circuit and elements of the second semiconductor chip SC2. FIG. 7 is a circuit schematic illustrating part of the circuit of the second semiconductor chip SC2.

As illustrated in FIG. 6, an analog circuit CIR is provided near the fifth side SID5 and the eighth side SID8 of the second semiconductor chip SC2. All of the electrode pads PAD2 provided along the fifth side SID5 and those provided along the eighth side SID8 are coupled to the analog circuit CIR.

As illustrated in FIG. 6, a plurality of power transistors PTR are provided near the sixth side SID6 and the seventh side SID7. Specifically, the power transistors PTR1 and the power transistors PTR2 are arranged to be lined up in a direction perpendicular to the sixth side SID6. In the vicinities of the sixth side SID6 and the seventh side SID7, the electrode pads PAD2 to be coupled to the power transistors PTR are located above the regions located between the power transistors PTR1 and PTR2. Accordingly, the distance between the electrode pads PAD2, arranged along the sixth side SID6, and the sixth side SID6 is larger than that between the electrode pads PAD2, arranged along the fifth side SID5, and the fifth side SID5. Similarly, the distance between the electrode pads PAD2, arranged along the seventh side SID7, and the seventh side SID7 is larger than that between the electrode pads PAD2, arranged along the fifth side SID5, and the fifth side SID5.

In detail, electrode pads PAD221, PAD222, and PAD223 are coupled to the power transistors PTR. As illustrated in the equivalent circuit schematic in FIG. 7, a power supply voltage $V_{cc}$ is applied to the electrode pad PAD221, and a ground potential $V_s$ is applied to the electrode pad PAD223. The electrode pad PAD222 serves as an output terminal of the power transistor PTR.

The distance between the electrode pads PAD2 arranged along the sixth side SID6, and the sixth side SID6 is larger than that between the electrode pads PAD2 arranged along the fifth side SID5, and the fifth side SID5, so that the distance between the bonding wire WIR2 and the second terminal TER2, located next to the second terminal TER2 to which the bonding wire WIR2 is coupled, can be increased. Accordingly, a short circuit between the bonding wire WIR2 and the second terminal TER2 to which the bonding wire WIR2 should not be originally coupled, can be suppressed. This advantage can also be obtained in the bonding wires WIR2 coupled to the electrode pads PAD2 arranged along the seventh side SID7.

Hereinafter, a method of manufacturing the semiconductor device SD will be described with reference to FIGS. 8 to 10.

The first semiconductor chip SC1 and the second semiconductor chip SC2 are first provided. The first semiconductor chip SC1 and the second semiconductor chip SC2 are manufactured, for example, as follows.

An element isolation film is first formed in a semiconductor substrate. Thereby, an element formation region is isolated. The element isolation film is formed, for example, by using an STI method, but may be formed by using a LOCOS method. Subsequently, a gate insulating film and a gate electrode are formed in the semiconductor substrate located in the element formation region. The gate insulating film may be a silicon oxide film or a high dielectric constant film (e.g., a hafnium silicate film) having a dielectric constant higher than that of a silicon oxide film. When the gate insulating film is a silicon oxide film, the gate electrode is formed by a polysilicon film. Alternatively, when the gate insulating film is a high dielectric constant film, the gate electrode is formed by a laminated film of a metal film (e.g., TiN film) and a polysilicon film. When the gate electrode is formed by polysilicon, a polysilicon resistance may be formed over the element isolation film in the step of forming the gate electrode.

In the second semiconductor chip SC2, the power transistors PTR are formed in the aforementioned steps. Alternatively, the gate insulating film of the power transistors PTR may be formed in a step different from the step of forming the gate insulating film of other transistors.

Subsequently, an extension region for a source and a drain is formed in the semiconductor substrate located in the element formation region. Subsequently, a sidewall is formed in a side wall of the gate electrode. Subsequently, an impurity region that will serve as the source and the drain is formed in the semiconductor substrate located in the element formation region. Thus, a MOS transistor is formed over the semiconductor substrate.

Subsequently, a multilayer interconnection layer is formed over the element isolation film and the MOS transistor. The electrode pads (electrode pads PAD1 or electrode pads PAD2) are formed in the uppermost interconnection layer. Subsequently, a protective insulating film (passivation film) is formed over the multilayer interconnection layer. Openings located over the electrode pads are formed in the protective insulating film.

Figure 8:
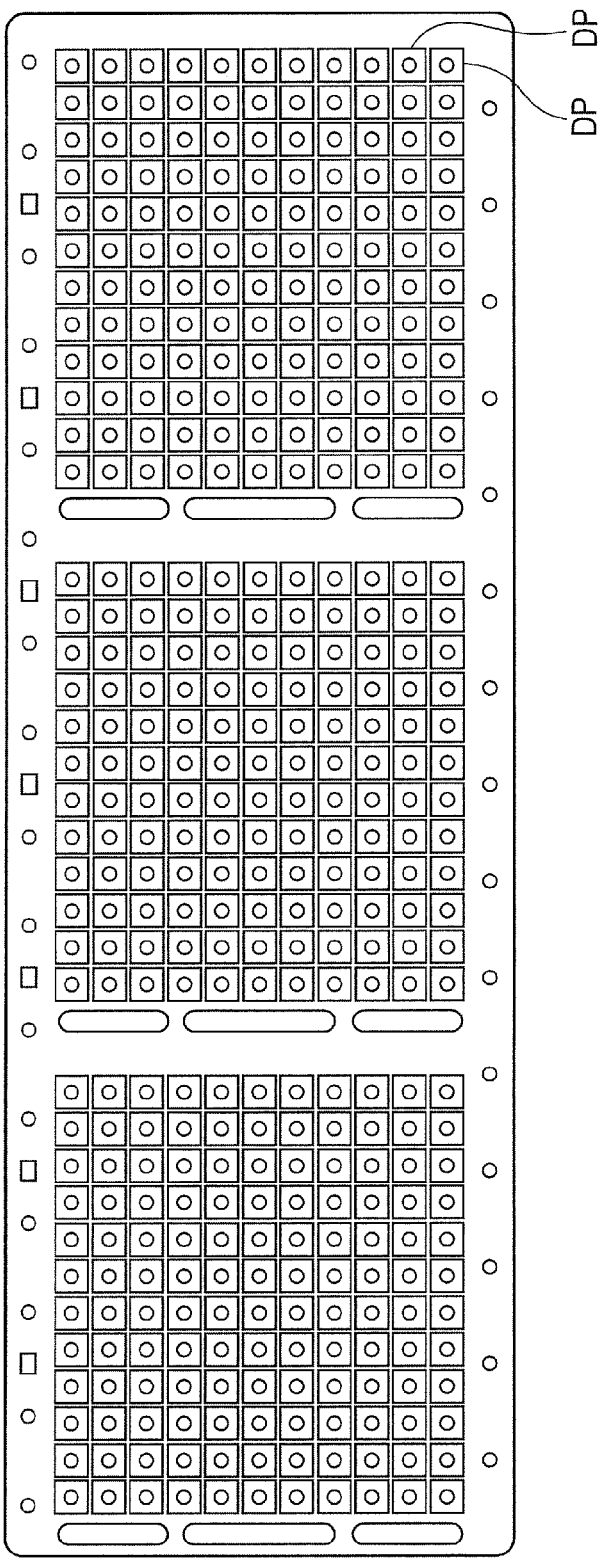
FIG. 8 is a view illustrating a method of manufacturing a semiconductor device.

The chip mounting part DP illustrated in FIG. 8 is provided. In the example illustrated in this view, the chip mounting part DP is a lead frame. A plurality of the chip mounting parts DP form a so-called MAP type in which they are coupled together via frames.

Subsequently, the first semiconductor chip SC1 and the second semiconductor chip SC2 are mounted over each of the chip mounting parts DP, as illustrated in FIG. 9. The first semiconductor chip SC1 and the second semiconductor chip SC2 may be mounted over the chip mounting part DP by using a paste material such as silver paste or by using a DAF (Die Attachment Film).

Subsequently, the electrode pad PAD1 of the first semiconductor chip SC1 is coupled to the first terminal TER1 via the bonding wire WIR1, as illustrated in FIG. 10. Further, the electrode pad PAD2 of the second semiconductor chip SC2 is coupled to the second terminal TER2 via the bonding wire WIR2. Furthermore, the first electrode pad PAD11 of the first semiconductor chip SC1 and the second electrode pad PAD21 of the second semiconductor chip SC2 are coupled to each other via the bonding wire WIR3.

Subsequently, the chip mounting parts DP, and the first semiconductor chip SC1, the second semiconductor chip SC2, and the bonding wires WIR1, WIR2, and WIR3 which are located over the chip mounting parts DP, are collectively sealed with the sealing resin MDR. The semiconductor devices SD are then individually separated.

Figure 11:
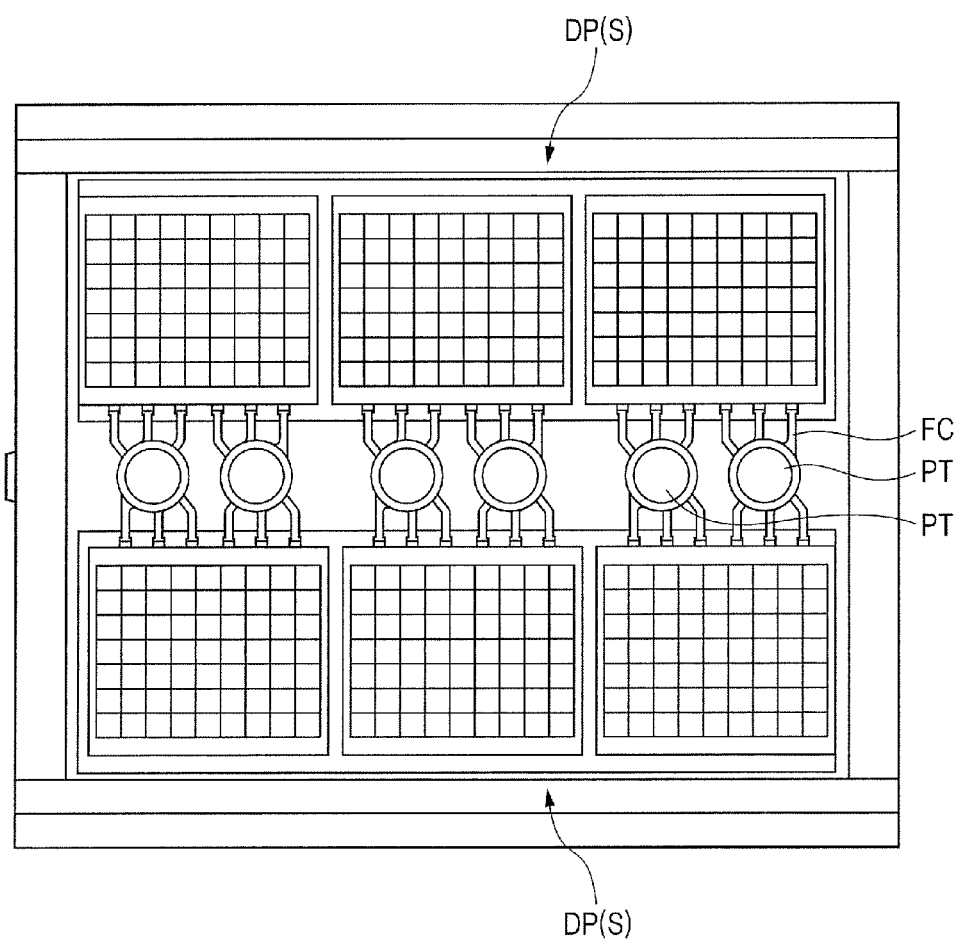
FIG. 11 is a plan view illustrating a configuration of an apparatus by which a sealing step using a sealing resin is performed.

FIG. 11 is a plan view illustrating a configuration of an apparatus by which a sealing step using the sealing resin MDR is performed. In the example illustrated in this view, the sealing resin MDR is held in resin holding parts PT. A space S, in which the chip mounting parts DP of MAP type are held, and the resin holding parts PT are coupled together via flow channels FC. When the sealing resin MDR is extruded from the resin holding parts PT, the extruded sealing resin MDR flows into the space S via the flow channels FC. Thereby, the chip mounting parts DP, and the like, are sealed with the sealing resin MDR. Thus, the sealing resin MDR flows in from one direction of the chip mounting parts DP in the sealing step.

Figure 12:
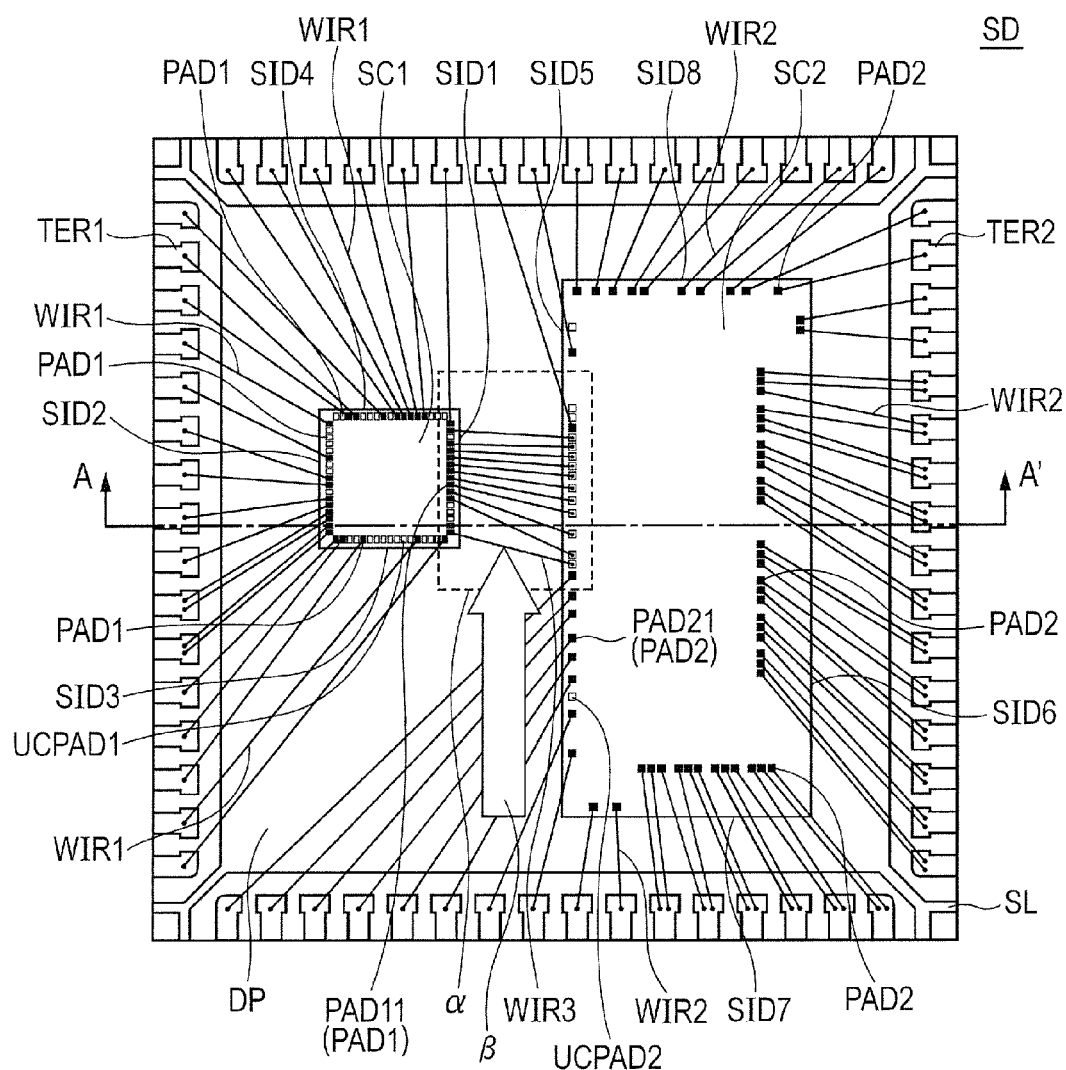
FIG. 12 is a view for explaining a flow of the sealing resin that will cause a wire flow.

FIG. 12 is a view for explaining a flow of the sealing resin MDR that will cause a wire flow. As described above, the sealing resin MDR flows in from one direction (arrow β direction) of the chip mounting part DP in the sealing step. In the present embodiment, the chip mounting parts DP of MAP type are arranged in the space S illustrated in FIG. 11 such that the sealing resin MDR flows in from the side of the third side SID3 of the first semiconductor chip SC1, in other words, such that the third side SID3 faces the flow channels FC. Accordingly, the bonding wires WIR3 are curved in a direction of being convex toward the fourth side SID4, when planarly viewed. In the present embodiment, however, the spaces between the bonding wires WIR3 are partially increased, and hence a short circuit between the adjacent bonding wires WIR3 can be suppressed, even if the bonding wires WIR3 are curved, in a plan view.

Further, the space between the bonding wires WIR3 located near to the fourth side SID4 is smaller than that between the bonding wires WIR3 located near to the third side SID3. Accordingly, the averages of both the spaces between the first electrode pads PAD11 of the first semiconductor chip SC1 and the spaces between the second electrode pads PAD21 of the second semiconductor chip SC2 can be suppressed from being increased, that is, these semiconductor chips can be suppressed from being increased in size.

In particular, the second semiconductor chip SC2 is an oblong in the present embodiment. Accordingly, when a general-purpose lead frame is used as the tip mounting part DP, the difference, between the length of one side of the chip mounting part DP and the total length of the length of the second side SID2 of the first semiconductor chip SC1 and the length of the seventh side SID7 of the second semiconductor chip SC2, becomes large to some extent. Accordingly, in order to reduce the total of the lengths of the bonding wires of the semiconductor device SD, it is required that the first side SID1 of the first semiconductor chip SC1 and the fifth side SID5 of the second semiconductor chip SC2 are spaced apart from each other to some extent. In this case, the bonding wires WIR3 become long to some extent, and hence a problem associated with the aforementioned wire flow is more likely to be caused. Also in this case, however, a short circuit between the adjacent bonding wires WIR3 can be suppressed, even if the bonding wires WIR3 are curved.

(First Variation)

Figure 13:
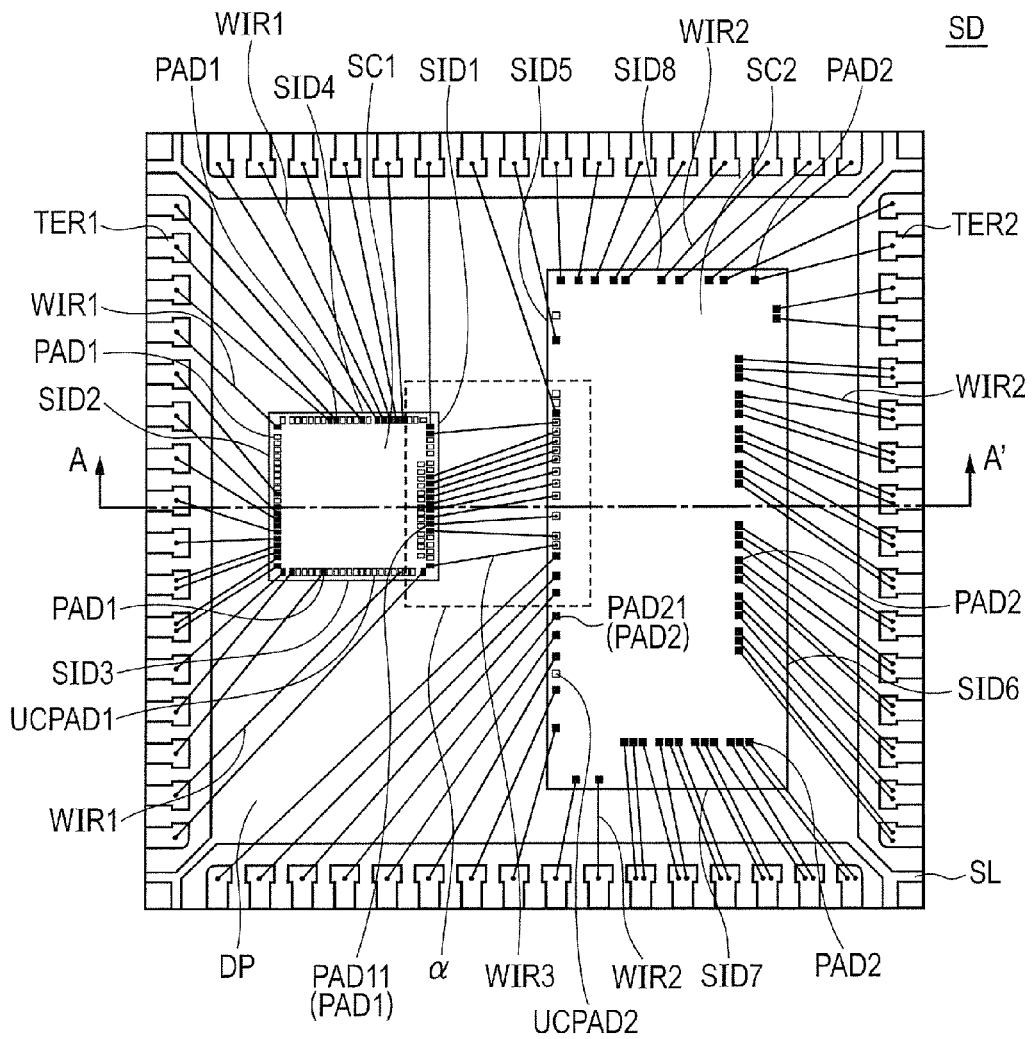
FIG. 13 is a plan view of a semiconductor device according to First Variation.
Figure 14:
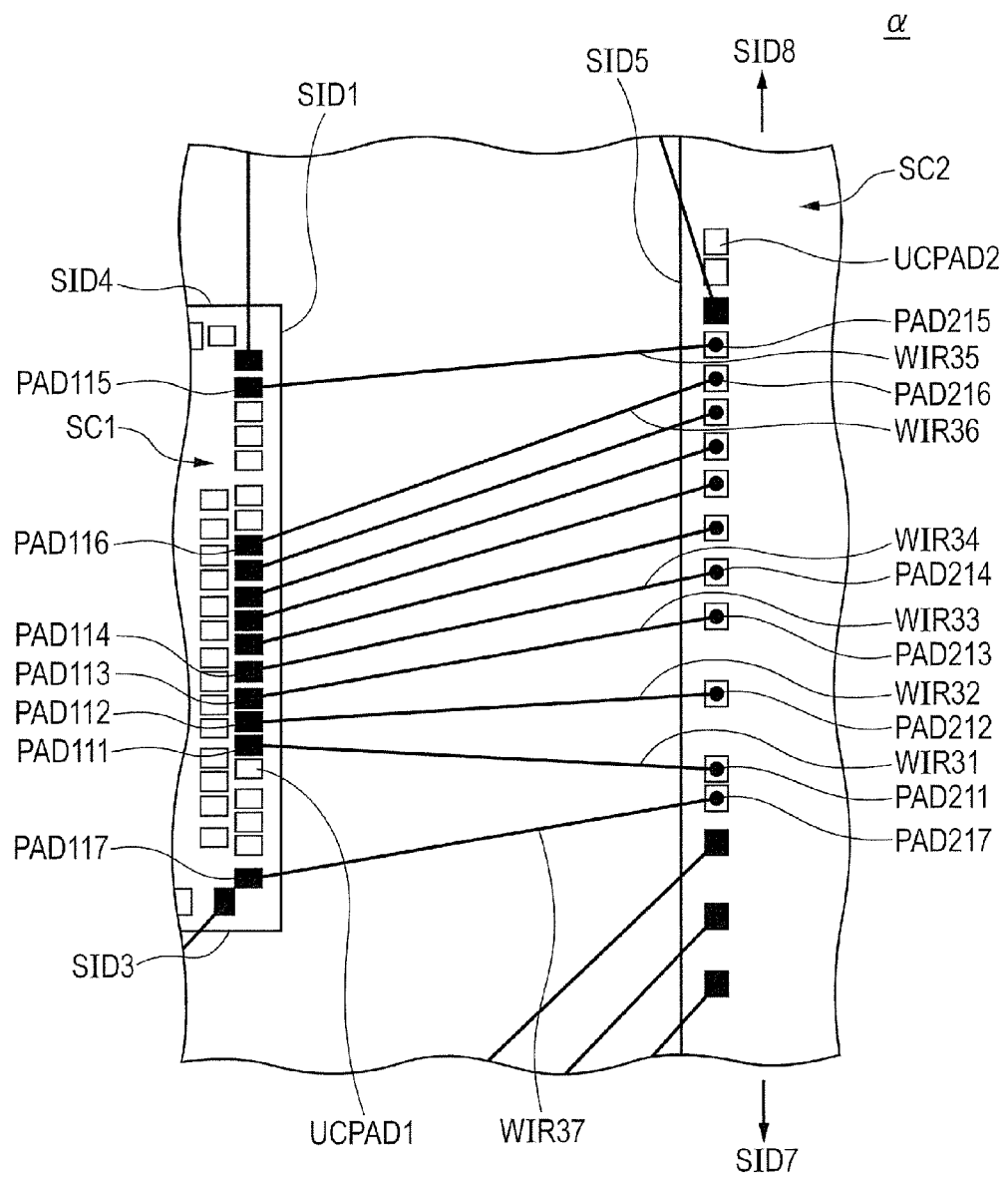
FIG. 14 is a view in which the region a in FIG. 13 is enlarged.

FIG. 13 is a plan view of a semiconductor device SD according to First Variation. FIG. 14 is a view in which the region a in FIG. 13 is enlarged. FIGS. 13 and 14 correspond to FIGS. 2 and 3 in the embodiment, respectively. The semiconductor device SD according to the present variation has the same configuration as that of the semiconductor device SD according to the embodiment, except for the arrangement of the first electrode pads PAD11 and the second electrode pads PAD21.

In detail, in the first bonding wire WIR31, the second bonding wire WIR32, the third bonding wire WIR33, and the fourth bonding wire WIR34, the ends of the fifth side SID5 side are inclined in the direction of approaching the eighth side SID7, in plan view, in the example illustrated in this view. Accordingly, a plurality of uncoupled electrode pads UCPAD1 are provided side by side in a direction along the first side SID1, in each of portions near both the ends of the first side SID1.

Further, a plurality of rows of the electrode pads PAD1 are provided in the first side SID1. However, all of the electrode pads PAD1 located near to the center (located inside) are uncoupled electrode pads UCPAD1.

The same advantages as those in the embodiment can also be obtained in the present variation.

(Second Variation)

Figure 15:
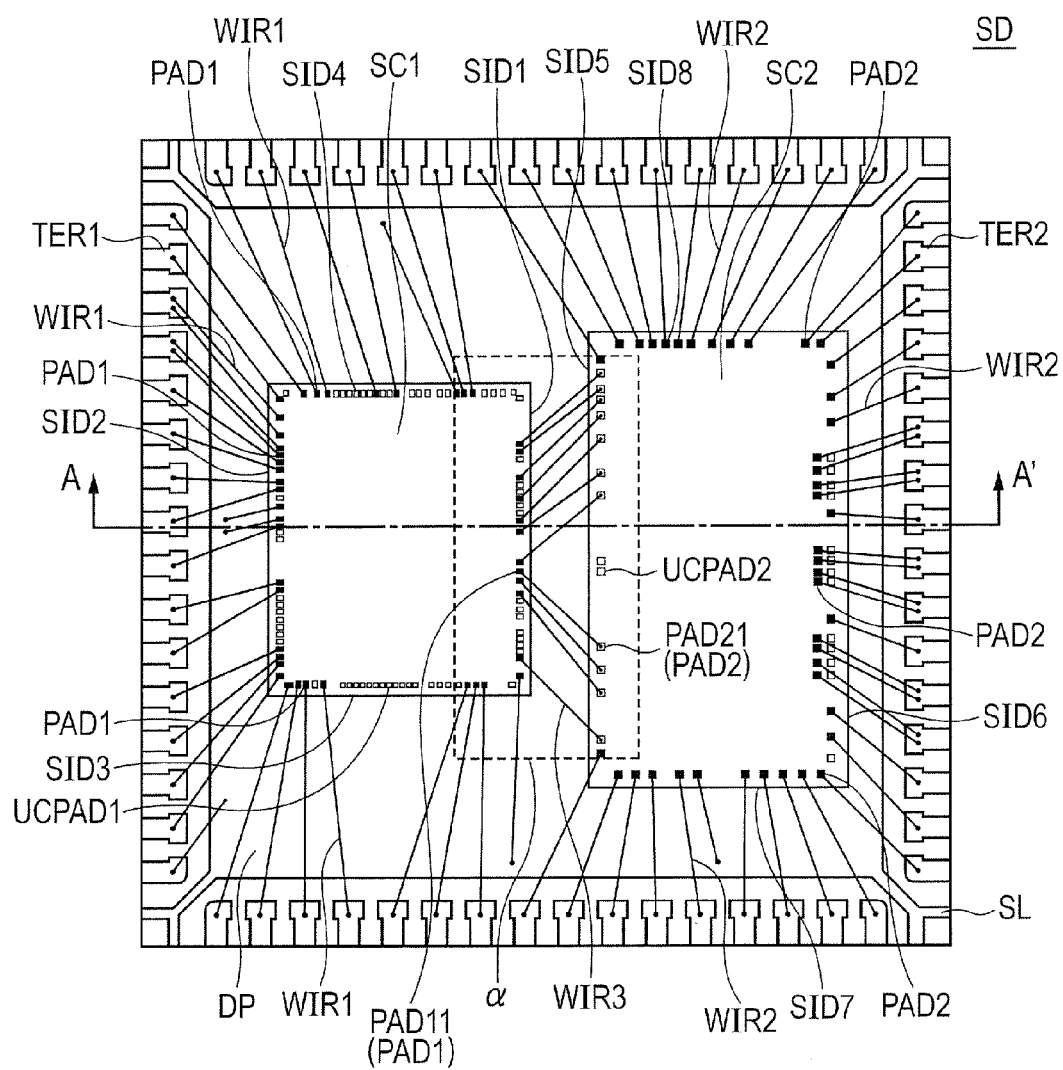
FIG. 15 is a plan view of a semiconductor device according to Second Variation.
Figure 16:
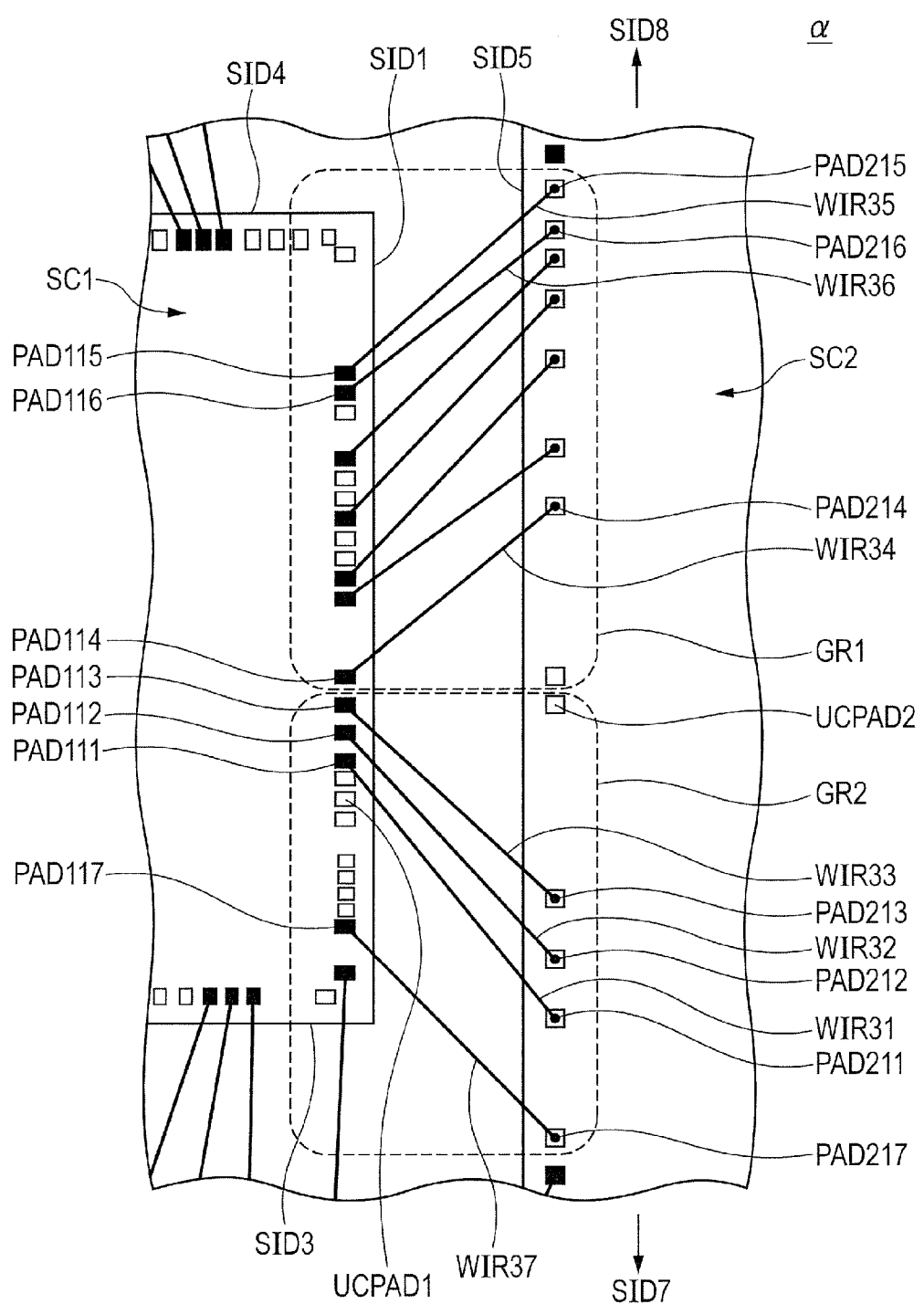
FIG. 16 is a view in which the region a in FIG. 15 is enlarged.

FIG. 15 is a plan view of a semiconductor device SD according to Second Variation. FIG. 16 is a view in which the region a in FIG. 15 is enlarged. FIGS. 15 and 16 correspond to FIGS. 2 and 3 in the embodiment, respectively. The semiconductor device SD according to the present variation has the same configuration as that of the semiconductor device SD according to the embodiment, except for the following points.

At first, the planar shape of the first semiconductor chip SC1 is also an oblong. The first side SID1 and the second side SID2 are the long sides of the first semiconductor chip SC1, while the third side SID3 and the fourth side SID4 are the short sides thereof.

The bonding wires WIR3 are divided into two groups GR1 and GR2. The bonding wires WIR3 belonging to the group GR1 are inclined in the same direction with respect to the first side SID1, when planarly viewed. The bonding wires WIR3 belonging to the group GR2 are inclined in a direction opposite to that of the bonding wires WIR3 belonging to the group GR1, when planarly viewed. In detail, the bonding wires WIR3 belonging to the group GR1 are inclined in a direction in which the ends thereof, located in the second electrode pads PAD21, approach the eighth side SID8, when planarly viewed. Also, the bonding wires WIR3 belonging to the group GR2 are inclined in a direction in which the ends thereof, located in the first electrode pads PAD11, approach the fourth side SID4, when planarly viewed.

The relationships among the bonding wires WIR3 belonging to the group GR1, the first electrode pads PAD11, and the second electrode pads PAD21, the latter two being coupled to the former bonding wires WIR3, are the same as those described in the embodiment. The relationships among the bonding wires WIR3 belonging to the group GR2, the first electrode pads PAD11, and the second electrode pads PAD21, the latter two being coupled to the former bonding wires WIR3, are also the same as those described in the embodiment.

The same advantages as those in the embodiment can also be obtained in the present variation.

(Third Variation)

Figure 17:
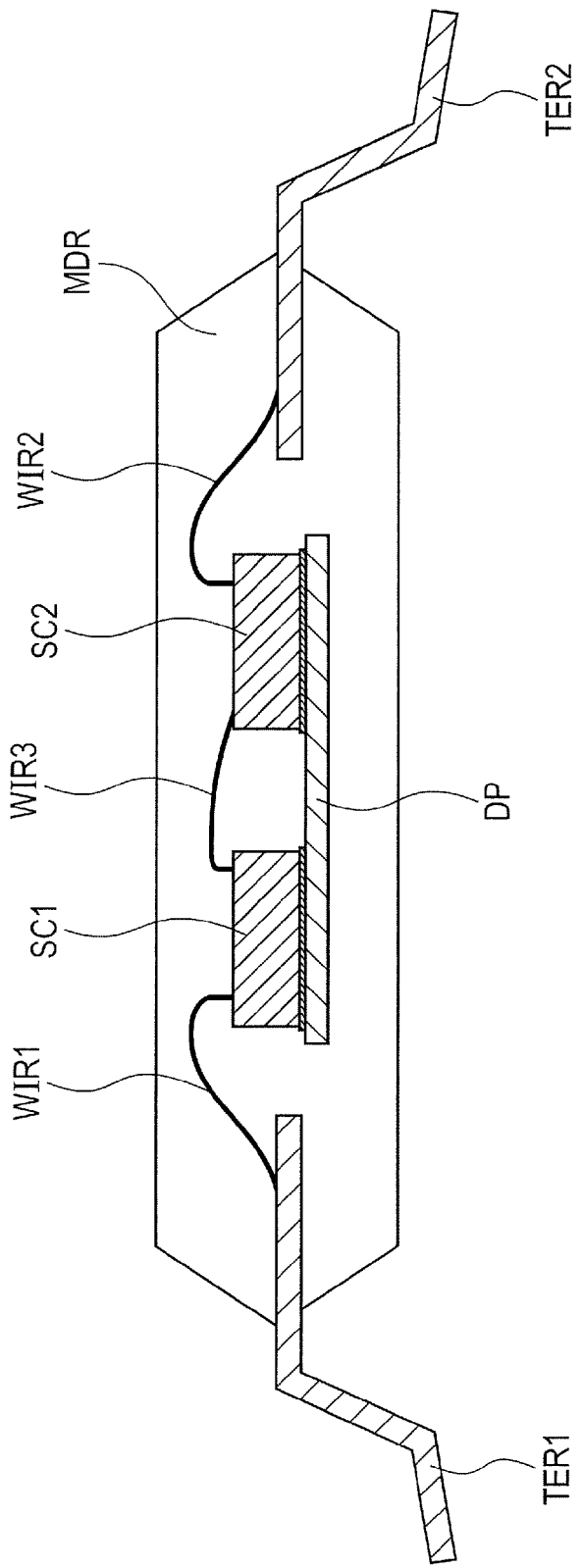
FIG. 17 is a sectional view illustrating a configuration of a semiconductor device according to Third Variation.

FIG. 17 is a sectional view illustrating a configuration of a semiconductor device SD according to Third Variation. The semiconductor device SD illustrated in this view has the same configuration as that of the semiconductor device SD according to any one of the embodiment, First Variation, and Second Variation, except that a sealing structure for the first semiconductor chip SC1 and the second semiconductor chip SC2 is a QFP (Quad Flat Package).

In detail, the second surface of the chip mounting part DP is covered with the sealing resin MDR. The first terminal TER1 and the second terminal TER2 are lead terminals and extend outside the sealing resin MDR.

The same advantages as those in the embodiment can also be obtained in the present variation.

(Fourth Variation)

Figure 18:
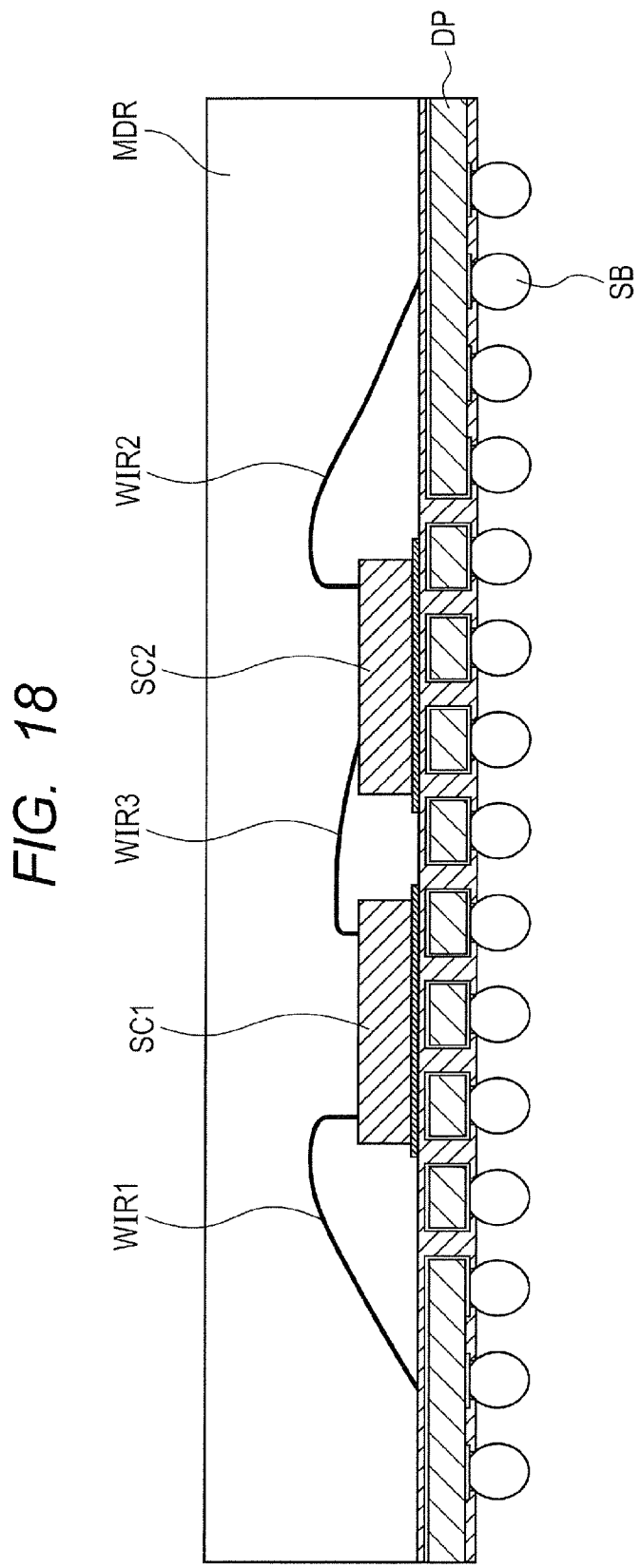
FIG. 18 is a sectional view illustrating a configuration of a semiconductor device according to Fourth Variation.

FIG. 18 is a sectional view illustrating a configuration of a semiconductor device SD according to Fourth Variation. The semiconductor device SD illustrated in this view has the same configuration as that of the semiconductor device SD according to any one of the embodiment, First Variation, and Second Variation, except that a sealing structure for the first semiconductor chip SC1 and the second semiconductor chip SC2 is a BGA (Ball Grid Array).

In detail, the chip mounting part DP is an interposer, and each of the bonding wires WIR1 and WIR2 is coupled to a finger over a first surface of the interposer. These fingers are coupled to solder balls SB provided in a second surface of the interposer via wiring and through-holes in the interposer.

The end surface of the sealing resin MDR forms the same surface as the end surface of the interposer (chip mounting part DP). However, the end surface of the sealing resin MDR may be located inside the end surface of the interposer.

The same advantages as those in the embodiment can also be obtained in the present variation.

The invention made by the present inventors has been specifically described above based on preferred embodiments, but the invention should not be limited to the preferred embodiments, and it is needless to say that various modifications may be made to the invention within a range not departing from the gist of the invention.

What is claimed is:

1. A semiconductor device comprising:
    a first semiconductor chip that is a rectangle having a first side, a second side facing the first side, a third side, and a fourth side;
    a second semiconductor chip that is a rectangle having a fifth side, a sixth side facing the fifth side, a seventh side, and an eighth side;
    a chip mounting part, over the same surface of which the first semiconductor chip and the second semiconductor chip are mounted; and
    a plurality of bonding wires that couple the first semiconductor chip to the second semiconductor chip,
    wherein the first side of the first semiconductor chip faces the fifth side of the second semiconductor chip,
    wherein the first semiconductor chip has a plurality of first electrode pads arranged along the first side,
    wherein the second semiconductor chip has a plurality of second electrode pads arranged along the fifth side,
    wherein, of the bonding wires, a first bonding wire, a second bonding wire, a third bonding wire, and a fourth bonding wire are lined up in this order along the first side,
    wherein, when viewed from a direction perpendicular to the chip mounting part, a maximum of a space between the first bonding wire and the second bonding wire is larger than that of a space between the second bonding wire and the third bonding wire, and
    wherein, when viewed from the direction perpendicular to the chip mounting part, the maximum of the space between the second bonding wire and the third bonding wire is larger than that of a space between the third bonding wire and the fourth bonding wire.

2. The semiconductor device according to claim 1,
    wherein, when viewed from the direction perpendicular to the chip mounting part, the first bonding wire is located nearer to the third side than the fourth bonding wire is, and is curved in a direction of being convex toward the fourth side.

3. The semiconductor device according to claim 1,
    wherein the fifth side is longer than the first side, and
    wherein the second semiconductor chip is an oblong and the fifth side is a long side of the oblong.

4. The semiconductor device according to claim 3,
    wherein the first bonding wire, the second bonding wire, the third bonding wire, and the fourth bonding wire couple, on a one-to-one basis, the first electrode pads to the second electrode pads, and
    wherein a space between the second electrode pad coupled to the first bonding wire and the second electrode pad coupled to the second bonding wire is larger than that between the second electrode pad coupled to the second bonding wire and the second electrode pad coupled to the third bonding wire, and
    wherein the space between the second electrode pad coupled to the second bonding wire and the second electrode pad coupled to the third bonding wire is larger than that between the second electrode pad coupled to the third bonding wire and the second electrode pad coupled to the fourth bonding wire.

5. The semiconductor device according to claim 1,
    wherein the first semiconductor chip has an uncoupled electrode pad that is arranged along the first side and located at a place different from a space between the first bonding wire and the fourth bonding, and to which the bonding wire is not coupled.

6. A semiconductor device comprising:
    a first semiconductor chip that is a rectangle having a first side, a second side facing the first side, a third side, and a fourth side;
    a second semiconductor chip that is a rectangle having a fifth side, a sixth side facing the fifth side, a seventh side, and an eighth side;
    a chip mounting part, over the same surface of which the first semiconductor chip and the second semiconductor chip are mounted; and
    a plurality of bonding wires that couple the first semiconductor chip to the second semiconductor chip,
    wherein the first side of the first semiconductor chip faces the fifth side of the second semiconductor chip, and
    wherein the first semiconductor chip has a plurality of first electrode pads arranged along the first side, and
    wherein the second semiconductor chip has a plurality of second electrode pads arranged along the fifth side, and
    wherein, of the bonding wires, a first boding wire, a second bonding wire, a third bonding wire, and a fourth bonding wire are lined up in this order along the first side, and they couple, on a one-to-one basis, the first electrode pads to the second electrode pads, and
    wherein, when viewed from a direction perpendicular to the chip mounting part, a space between the second electrode pad coupled to the first bonding wire and the second electrode pad coupled to the second bonding wire is larger than that between the second electrode pad coupled to the second bonding wire and the second electrode pad coupled to the third bonding wire, and
    wherein, when viewed from the direction perpendicular to the chip mounting part, the space between the second electrode pad coupled to the second bonding wire and the second electrode pad coupled to the third bonding wire is larger than that between the second electrode pad coupled to the third bonding wire and the second electrode pad coupled to the fourth bonding wire.

7. The semiconductor device according to claim 6,
    wherein, when viewed from the direction perpendicular to the chip mounting part, the first bonding wire is located nearer to the third side than the fourth bonding wire is, and is curved in a direction of being convex toward the fourth side.

8. The semiconductor device according to claim 6,
    wherein the fifth side is longer than the first side, and
    wherein the second semiconductor chip is an oblong and the fifth side is a long side of the oblong.

9. A method of manufacturing a semiconductor device comprising the steps of:
    mounting a first semiconductor chip, which is a rectangle having a first side, a second side facing the first side, a third side, and a fourth side, and a second semiconductor chip, which is a rectangle having a fifth side, a sixth side facing the fifth side, a seventh side, and an eighth side, over the same surface of a chip mounting part;

coupling the first semiconductor chip and the second semiconductor with a plurality of bonding wires; and sealing the first semiconductor chip, the second semiconductor chip, and the bonding wires with a sealing resin by pouring the sealing resin from the side of the third side, wherein the first side of the first semiconductor chip faces the fifth side of the second semiconductor chip, wherein the first semiconductor chip has a plurality of first electrode pads arranged along the first side, wherein the second semiconductor chip has a plurality of second electrode pads arranged along the fifth side, wherein, of the bonding wires, a first bond wire, a second bonding wire, a third bonding wire, and a fourth bonding wire are lined up in this order from the side of the third side along the first side, and they couple, on a one-to-one basis, the first electrode pads to the second electrode pads, wherein, when viewed from a direction perpendicular to the chip mounting part, a space between the second electrode pad coupled to the first bonding wire and the second electrode pad coupled to the second bonding wire is larger than that between the second electrode pad coupled to the second bonding wire and the second electrode pad coupled to the third bonding wire, and wherein, when viewed from the direction perpendicular to the chip mounting part, the space between the second electrode pad coupled to the second bonding wire and the second electrode pad coupled to the third bonding wire is larger than that between the second electrode pad coupled to the third bonding wire and the second electrode pad coupled to the fourth bonding wire.

* * * * *